United States Patent [19]

Kapoor

[11] Patent Number: 5,521,117
[45] Date of Patent: May 28, 1996

[54] PROCESS FOR ACTIVE DEVICE CONSTRUCTED IN OPENING FORMED IN INSULATION LAYER WITH A RESISTOR

[75] Inventor: Ashok K. Kapoor, Palo Alto, Calif.

[73] Assignee: LSI Logic Corporation, Milpitas, Calif.

[21] Appl. No.: 462,075

[22] Filed: Jun. 5, 1995

Related U.S. Application Data

[62] Division of Ser. No. 330,062, Oct. 26, 1994, and a division of Ser. No. 147,290, Nov. 1, 1993, Pat. No. 5,391,505.

[51] Int. Cl.$^6$ ................................................. H01L 21/8244
[52] U.S. Cl. ........................ 437/60; 437/915; 437/918
[58] Field of Search ............................ 437/47, 60, 195, 437/915, 918; 148/DIG. 136

[56] References Cited

U.S. PATENT DOCUMENTS

| | | | |
|---|---|---|---|
| 5,112,765 | 5/1992 | Cederbaum et al. | 437/915 |
| 5,159,430 | 10/1992 | Manning et al. | 357/51 |
| 5,168,076 | 12/1992 | Lee et al. | 437/60 |
| 5,177,030 | 1/1993 | Godinho et al. | 437/918 |
| 5,293,053 | 3/1994 | Malhi et al. | 257/330 |
| 5,381,046 | 1/1995 | Cederbaum et al. | 257/760 |

*Primary Examiner*—Chandra Chaudhari
*Attorney, Agent, or Firm*—John P. Taylor

[57] ABSTRACT

A compact MOS type active device is constructed at least partially in an opening in an insulation layer, such as an oxide layer, above a portion of a semiconductor substrate forming a first source/drain region of the MOS type active device. A semiconductor material, on the sidewall of the opening, and in electrical communication with the portion of the substrate forming the first source/drain region of the device, comprises the channel portion of the MOS device. A second source/drain region, in communication with an opposite end of the channel, is formed on the insulation layer adjacent the opening and in electrical communication with the channel material in the opening. A gate oxide layer is formed over the channel portion and at least partially in the opening, and a conductive gate electrode is then formed above the gate oxide. In this embodiment, the memory transistors are connected to the Vcc bus by resistors.

2 Claims, 9 Drawing Sheets

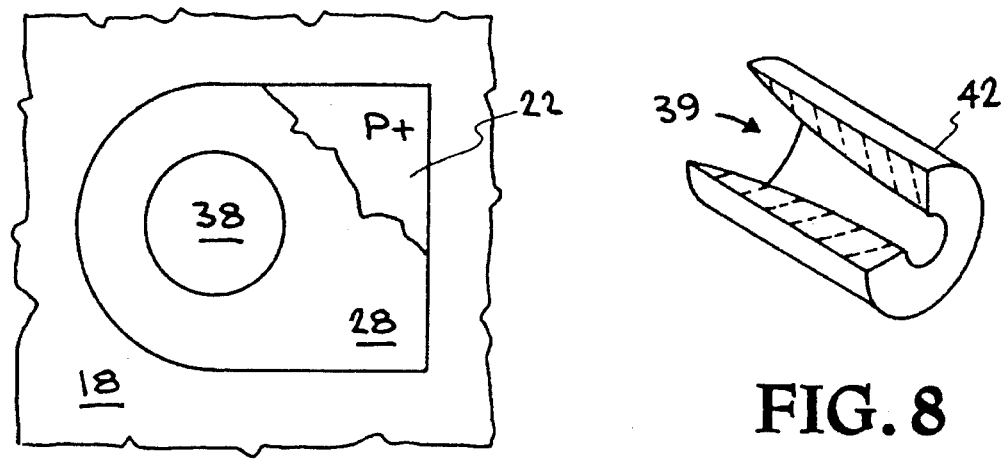
FIG. 5
FIG. 8
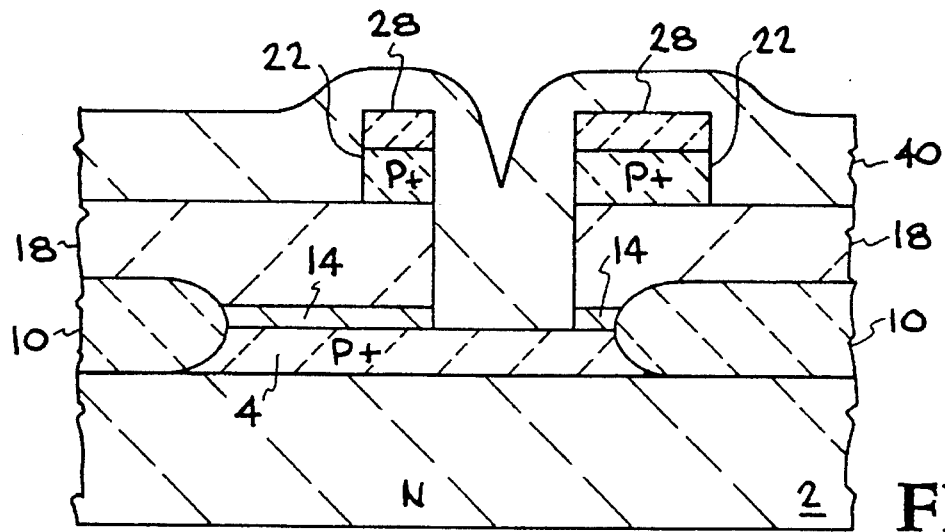
FIG. 6
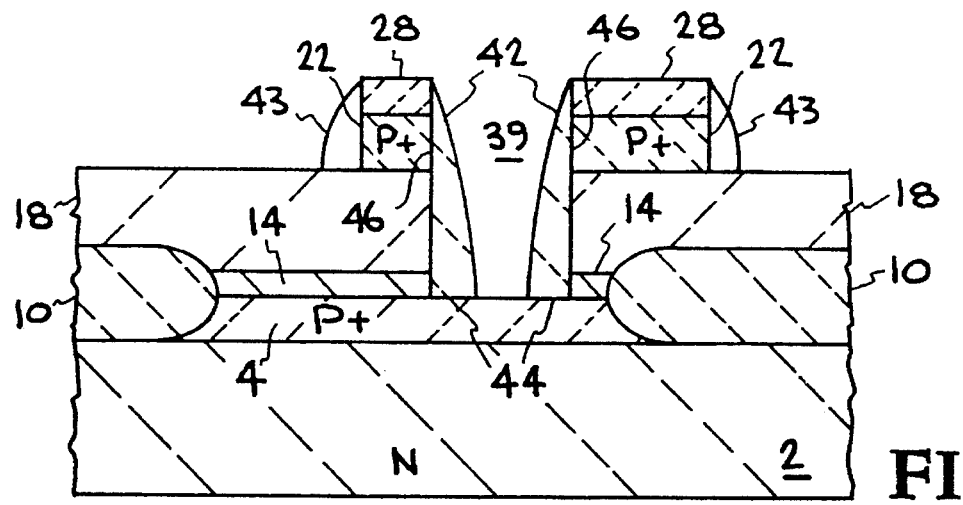
FIG. 7

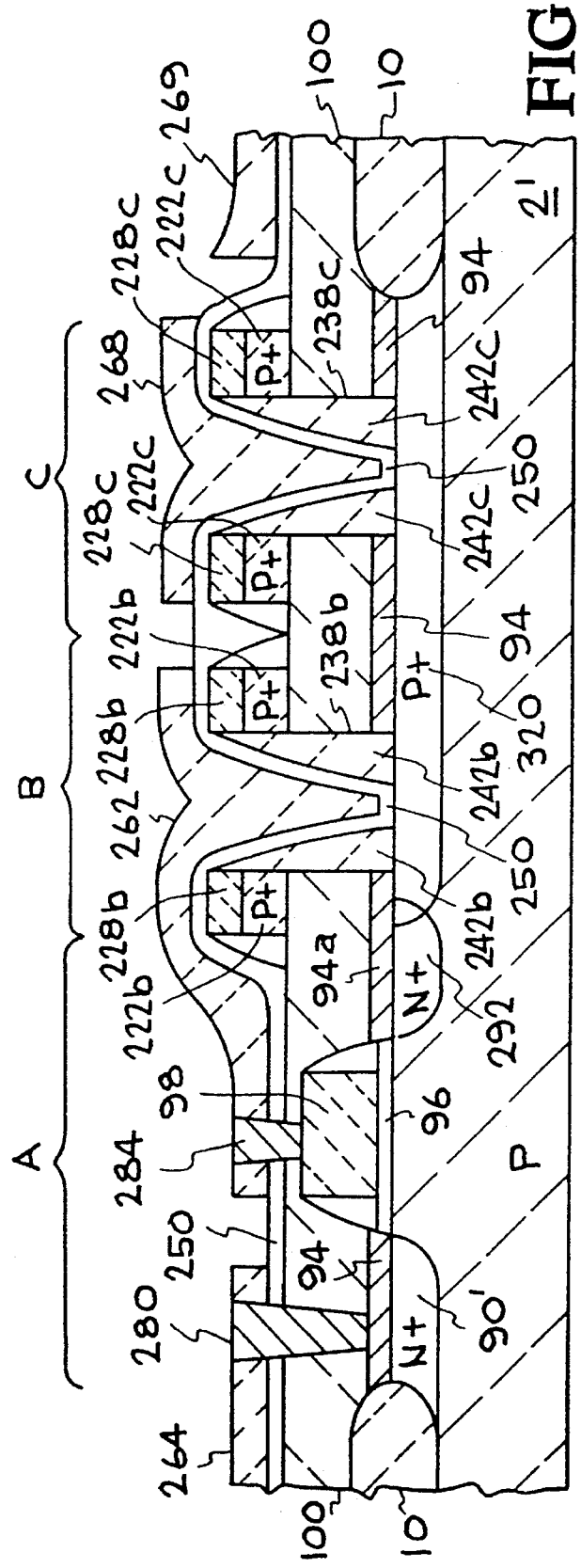
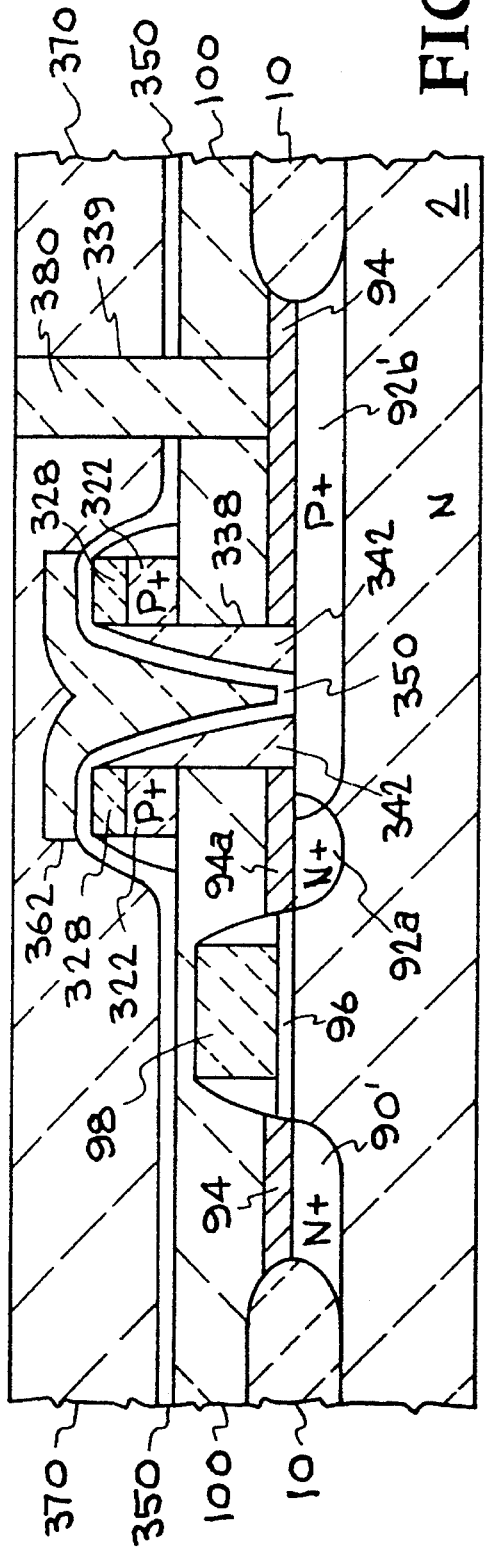
FIG. 23
FIG. 26

5,521,117

PROCESS FOR ACTIVE DEVICE CONSTRUCTED IN OPENING FORMED IN INSULATION LAYER WITH A RESISTOR

CROSS-REFERENCE TO RELATED APPLICATIONS

This application is a division of application Ser. No. 08/330,062, filed Oct. 26, 1994 as a division of Ser. No. 08/147,290, filed Nov. 1, 1993 now issued as U.S. Pat. No. 5,391,505 on Feb. 21, 1995.

BACKGROUND OF THE INVENTION

1. Field of the Invention

This invention relates to the construction of an active device and a process for forming same. More particularly, this invention relates to an active device constructed at least partially in an opening in an insulated layer over a semiconductor substrate, and a process for forming same.

2. Description of the Related Art

In the construction of integrated circuit structures on semiconductor wafers on an ever increasing very large scale integration (VLSI) basis, every effort is being made to provide smaller active devices to thereby accommodate the need to provide thousands of such active devices on a single chip or die. However, there are limits to how small an active device may be formed. Furthermore, the shrinking of the size of such active devices also creates the need to provide smaller contacts and connections to and from such active devices.

It would, therefore, be advantageous to provide an active device in a smaller horizontal area, as well as providing more compact means for interconnecting such an active device with one or more adjacent active devices.

SUMMARY OF THE INVENTION

It is, therefore, an object of the invention to provide an MOS type active device constructed at least partially in an opening in an insulation layer over a semiconductor substrate.

It is a further object of the invention to provide a compact MOS type active device, constructed at least partially in an opening in an insulation layer above a portion of a semiconductor substrate forming a first source/drain region of the MOS device.

It is another object of the invention to provide a compact MOS type active device constructed at least partially in an opening in an insulation layer above a portion of a semiconductor substrate forming a first source/drain region of the MOS device, wherein a semiconductor material on the sidewall of the opening, and in electrical communication, at one end, with the portion of the substrate forming the first source/drain region of the device, comprises the channel portion of the MOS device.

It is yet another object of the invention to provide a compact MOS type active device constructed at least partially in an opening in an insulation layer above a portion of a semiconductor substrate forming a first source/drain region of the MOS device; a semiconductor material on the sidewall of the opening, and in electrical communication, at one end, with the portion of the substrate forming the first source/drain region of the MOS device, comprises the channel portion of the MOS device; and a second source/drain region, in communication with an opposite end of the channel, is formed on the insulation layer adjacent the opening therein.

In accordance with the invention, a compact MOS type active device is constructed at least partially in an opening in an insulation layer above a portion of a semiconductor substrate forming a first source/drain region of the MOS type active device; a semiconductor material on the sidewall of the opening, and in electrical communication, at one end, with the portion of the substrate forming the first source/drain region of the device, comprises the channel portion of the MOS device; a second source/drain region, in communication with an opposite end of the channel portion, is formed above the opening in the insulation layer; a gate oxide layer is formed over the channel portion and at least partially in the opening; and a conductive gate electrode is formed above the gate oxide.

These and other objects will be clearer from the following description and accompanying drawings.

BRIEF DESCRIPTION OF THE DRAWINGS

FIG. 5 is a fragmentary top view of a portion of FIG. 4.

FIGS. 6–7 are fragmentary cross-sectional views of further sequential steps in the construction of the active device of the invention.

FIG. 8 is an isometric view of the polysilicon material comprising the channel portion of the active device on the sidewall of an opening in an oxide layer.

FIG. 23 is a fragmentary cross-sectional view of another embodiment of the invention showing two active devices of the invention coupled together with a conventionally formed MOS transistor to form the left half of the memory cell shown in the schematic of FIG. 15.

FIG. 26 is a fragmentary cross-section view of a structure containing the active device of the invention and implementing the portion in dotted lines of the schematic of FIG. 25.

DETAILED DESCRIPTION OF THE INVENTION

The invention comprises a compact MOS type active device constructed at least partially in an opening in an insulation layer of an integrated circuit structure. The insulation layer containing the opening is usually formed over a portion of a semiconductor wafer, and the opening then extends through the insulation layer to expose a portion of the underlying semiconductor wafer. This exposed portion of the semiconductor wafer is appropriately doped to form one source/drain region of the MOS type active device to be formed in the opening.

The opening in the insulation layer is usually circular in cross-section, i.e., defines a cylinder, but it will be understood that in the practice of the invention, the cross-section of the opening in the insulation layer may define any geometric shape, e.g., any polygonal shape, in accordance with the invention.

Figure 1:
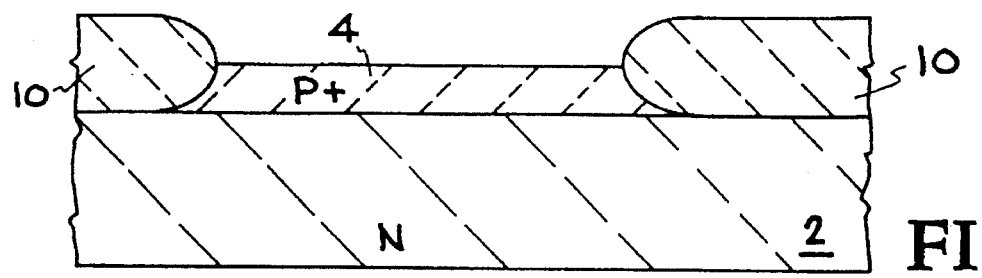
FIGS. 1–4 are sequential fragmentary cross-sectional views of the construction of the active device of the invention in an opening in an insulation layer over a doped region formed in between field oxide portions of a semiconductor wafer.

Referring now to FIGS. 1–14, the construction of the transistor of the invention will be sequentially illustrated by the construction of a P channel MOS transistor in an opening in an insulation layer, in accordance with the invention, it being understood that the construction of a P channel MOS device is only by way of illustration, and not of limitation. In FIG. 1, an N type semiconductor substrate 2 such as an N doped silicon wafer has field oxide portions 10 grown therein with one or more P+ doped regions 4 of the substrate formed in the regions not covered by field oxide 10. P+ region 4 will subsequently form one of the source/drain regions of the MOS transistor to be constructed in accordance with the invention.

Figure 2:
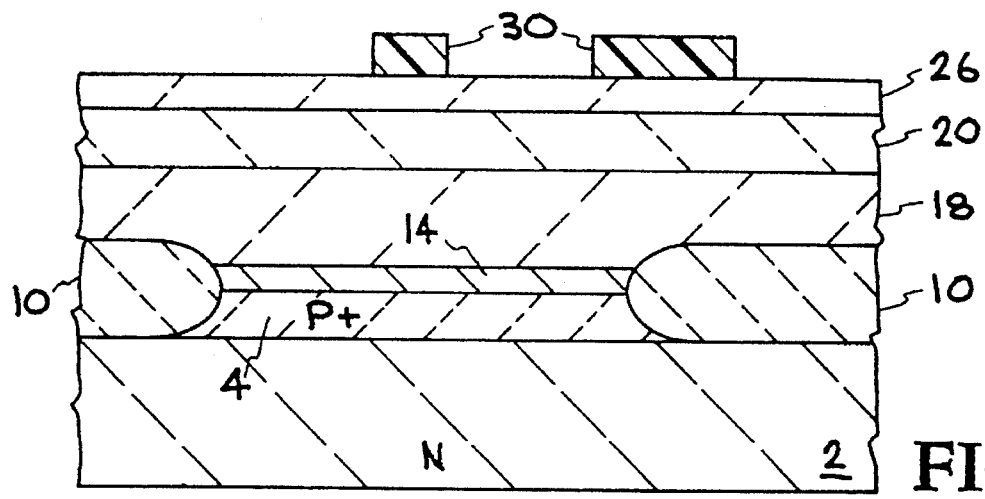

To facilitate subsequent connection to source/drain region 4 by a contact, a layer 14 of a metal silicide such as titanium silicide may be formed over the surface of P+ region 4, as shown in FIG. 2. Metal silicide layer 14 may be formed, for example, by depositing a layer of titanium over the silicon substrate and then annealing the structure to cause the titanium to react with the underlying silicon to form the desired titanium silicide surface layer.

Still referring to FIG. 2, a layer of oxide 18 is then formed over the structure, either by deposition or by growth of same, and a layer of P+ doped polysilicon 20 is then formed over oxide layer 18. From P+ doped polysilicon layer 20 will be formed the second source/drain region of the transistor of the invention as will be explained below. Following deposition of P+ polysilicon layer 20, a further layer of nitride 26 is deposited over polysilicon layer 20, and a photoresist mask 30 is then lo formed over nitride layer 26. Nitride layer 26 and polysilicon layer 20 are then etched through resist mask 30 to respectively form polysilicon portion 22 and nitride portion 28 overlying oxide layer 18, as shown in FIGS. 3–5.

Figure 3:
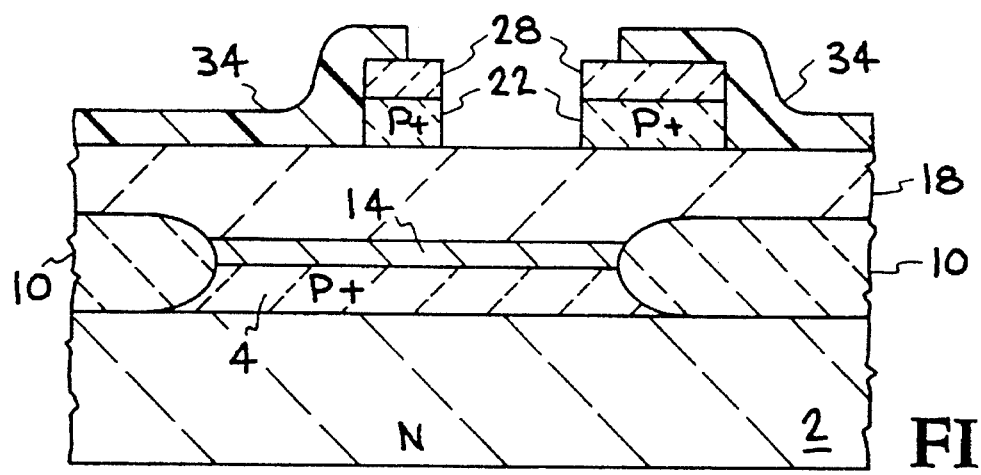
Figure 4:
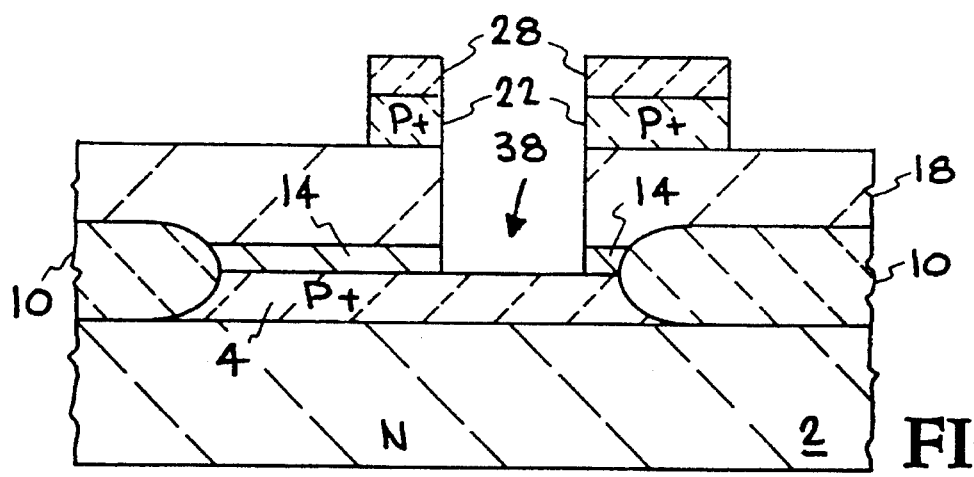

As shown in FIG. 3, a second resist mask 34 may then be formed over oxide layer 18 and a part of nitride portion 28, after removal of resist mask 30. Oxide layer 18 is then etched, through photoresist mask 34 and nitride portion 28 to form opening 38 therein, as shown in FIG. 4, followed by removal of the resist mask 34, and optional removal of nitride portion 28. While opening 38 may be of any geometric cross-section, opening 38 will be illustrated herein, for simplicity, as an opening of circular cross-section, i.e., cylindrical.

Following formation of opening 38 in oxide layer 18, a lightly N doped polysilicon layer 40 is deposited over the structure, as shown in FIG. 6, which at least partially fills opening 38. After deposition of polysilicon layer 40, the structure is anisotropically etched to remove the surface portions of layer 40, leaving N type polysilicon shoulder 42 on the sidewall of opening 38, as shown in FIG. 7. Polysilicon shoulders portions 43 are also shown formed externally around polysilicon portion 22 and nitride portion 28, by virtue of the anisotropic etch, but such are not used in the formation of the transistor of the invention.

It should be noted that while shoulder 42 appears to comprise two portions in FIG. 7, shoulder 42 actually comprises, in the illustrated embodiment, a single circular shoulder or coating formed one the sidewall of opening 38 by removing a generally conical central portion of what was initially a cylindrical portion of polysilicon layer 40 formed in opening 38. Thus, as best seen in FIG. 8, polysilicon shoulder 42 comprises a singular member, cylindrical in external profile, surrounding a generally conical opening 39 formed by the anisotropic etch. N type polysilicon shoulder 42, which is shown, in FIG. 7, in physical and electrical communication with both P+ source/drain region 4 (at 44), and P+ source/drain region 22 (at 46), will comprise the N channel portion of the transistor being constructed in opening 38 of oxide layer 18, and will be, therefore, hereinafter referred to as channel portion 42.

As noted previously, the cylindrical external shape of polysilicon channel portion 42, is only by way of illustration, by virtue of opening 38 being circular in cross-section. If opening 38 is formed of some other cross-sectional shape, then the external shape of polysilicon channel portion 42 will also assume such an external geometric form.

It should also be noted that while the formation of first source/drain region 4 in substrate 2 has been described as being carried out prior to the step of forming opening 38 in oxide layer 18, it is within the scope of the invention, in this embodiment, to form source/drain region 4 in substrate 2 by an implantation of substrate 2 through opening 38 in oxide layer 18 with the desired dopant, i.e., to form source/drain region 4 in substrate 2 after forming opening 38. In such instance, it may be feasible to deposit polysilicon layer 20 as an undoped layer, and then to form source/drain regions 4 and 22 simultaneously by implantation.

Figure 9:
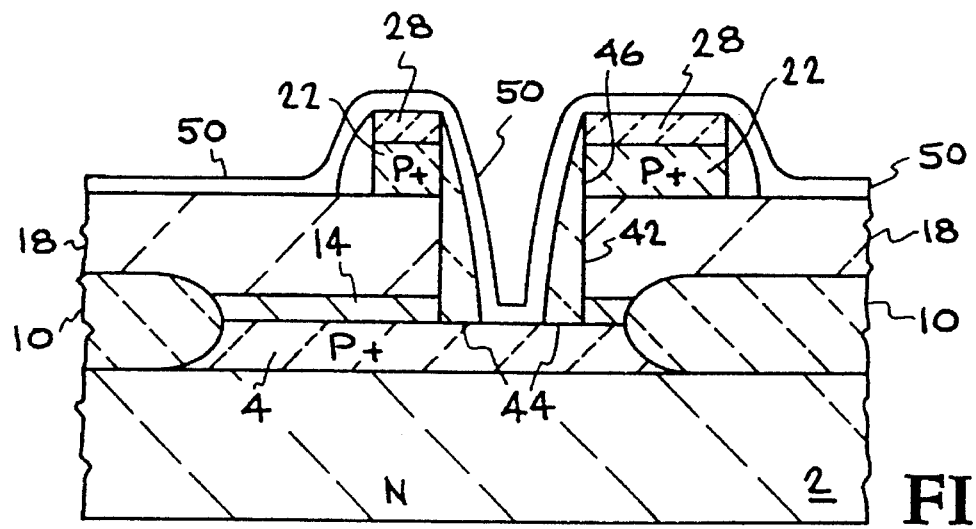
FIGS. 9–12 are fragmentary cross-sectional views of further sequential steps in the construction of the active device of the invention.
Figure 10:
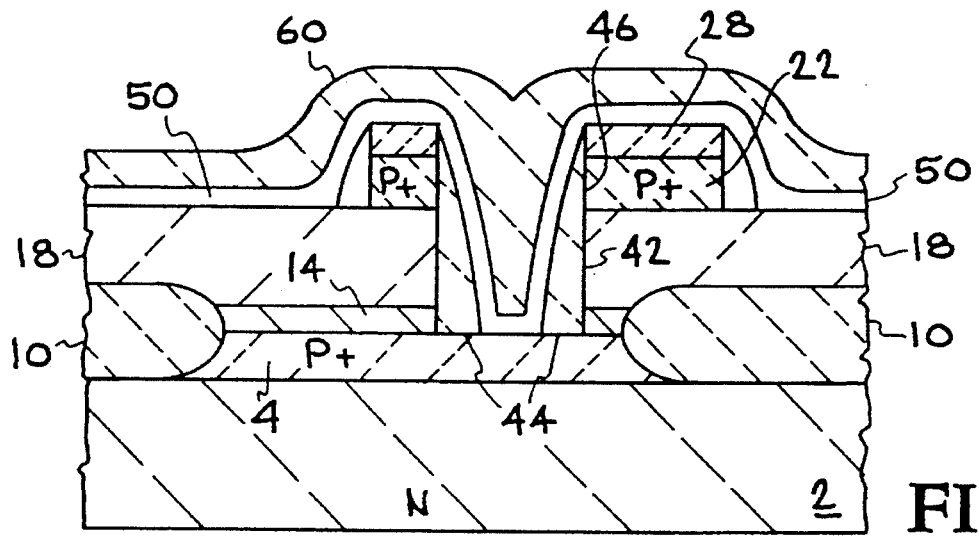

A thin oxide layer 50, e.g., having a thickness of from about 100 Angstroms to about 1000 Angstroms, is then deposited over the structure to provide a gate oxide over N channel polysilicon portion 42, as shown in FIG. 9. An N+ doped polysilicon layer 60 is then formed over oxide layer 50 to provide the gate electrode, as shown in FIG. 10, either by depositing a doped polysilicon layer, or by depositing an undoped polysilicon layer followed by doping by implantation and annealing.

Figure 11:
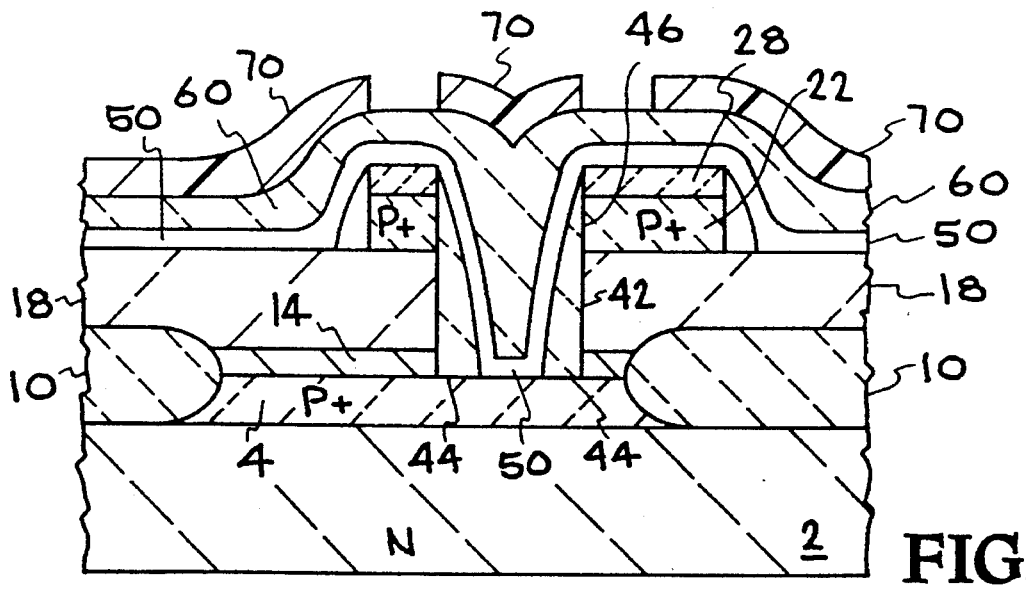
Figure 12:
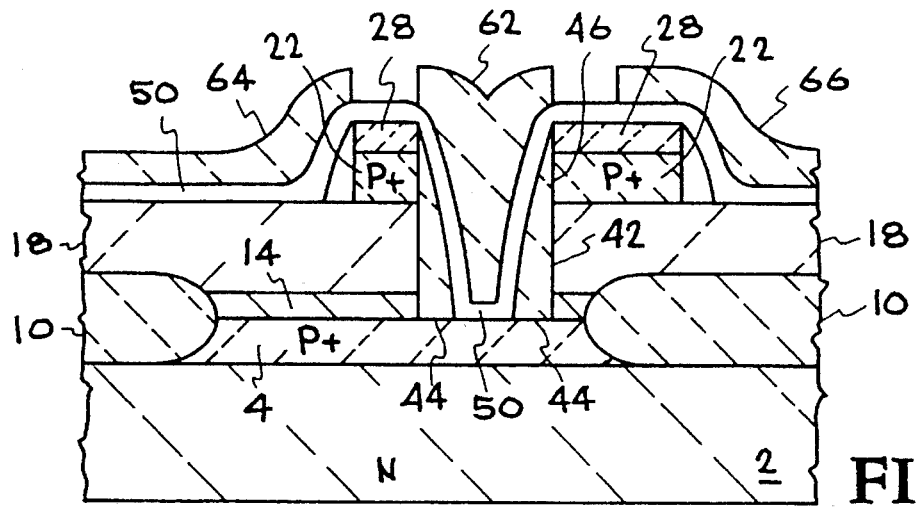
Figure 13:
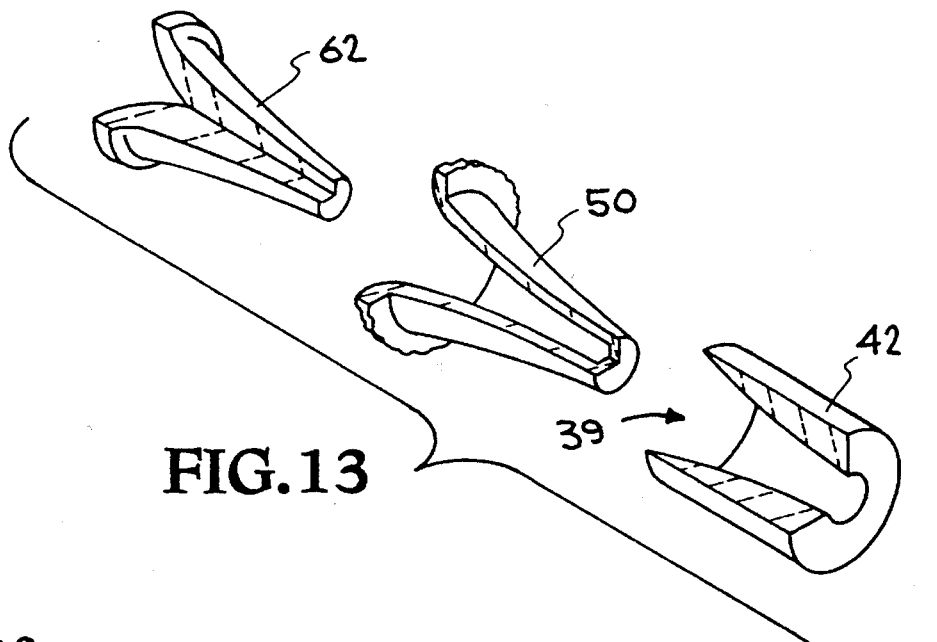
FIG. 13 is an exploded view showing the polysilicon channel, gate oxide, and gate electrode components of the active device of the invention.

A photoresist mask 70 may then be formed over polysilicon layer 60, as shown in FIG. 11. Polysilicon layer 60 may then be etched through mask layer 70 to form, in the illustrated embodiment, polysilicon gate electrode 62 and polysilicon portions 64 and 66, as shown in FIG. 12. FIG. 13 shows, in exploded form, polysilicon channel portion 42 formed by the anisotropic etch of polysilicon layer 40, gate oxide 50 formed over polysilicon channel 42, and gate electrode 62 formed over gate oxide 50.

Figure 14:
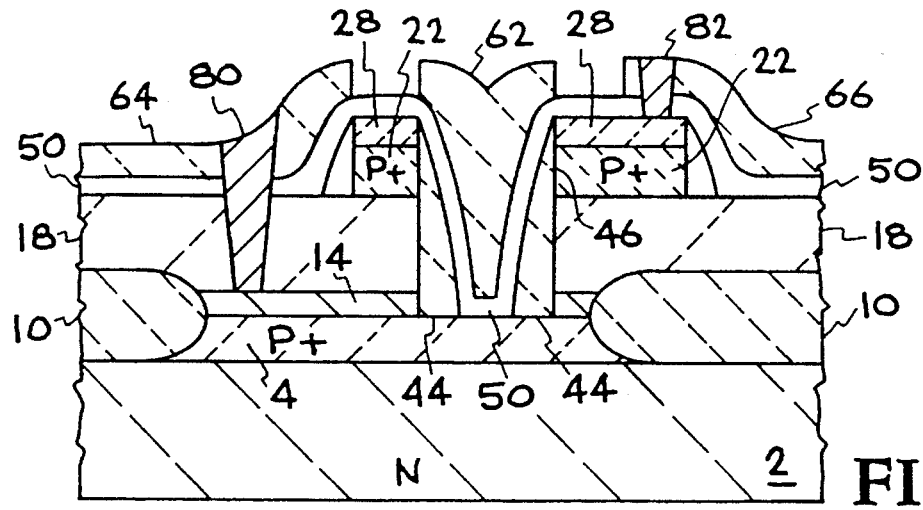
FIG. 14 is a fragmentary cross-sectional view of the finished active device of the invention.

Polysilicon portions 64 and 66 may be used, if desired and feasible, to form the respective electrodes for source/drain regions 4 and 22, as shown in FIG. 14, by the formation of contact opening 80 through oxide layers 50 and 18 to silicide portion 14 above source/drain region 4; and the formation of contact opening 82 through oxide layer 50 and nitride portion 28 to source/drain 22. Contact openings 80 and 82 may be filled by doped polysilicon or by other conductive materials such as tungsten, using conventional practices for forming and filling such contact openings. It will be understood, of course, that the formation of polysilicon electrodes 64 and 66 may be dispensed with, if it is desired to respectively connect the source/drain regions 4 and/or 22 directly with portions of a metal layer through appropriate contact openings similar to openings 80 and 82.

Thus, an MOS type transistor may be constructed at least partially within an opening formed in an insulation layer with a doped portion of the underlying semiconductor substrate forming a first source/drain region and a doped polysilicon portion, formed over the insulating layer and adjacent the opening therein, forming the second source/drain region. The channel portion of the device comprises a polysilicon material or layer formed on the insulation sidewall of the opening, by a deposition step followed by an anisotropic etch. Gate oxide is then formed over the polysilicon channel at least partially in the opening, and a gate electrode formed over the gate oxide also at least partially in the opening in the insulation layer. While construction of an N channel device has been illustrated, it will be immediately recognized that a P channel device can be constructed in the same manner, using a P type substrate having N+ source/drain regions with a P doped polysilicon channel then formed on the sidewall of the opening in the insulation layer.

While the MOS device of the invention may be formed and then used in connection with virtually any other device formed on the same substrate, it is of particular value when the source/drain portion of the device formed in the substrate can be directly coupled to another device through this portion of the substrate, since this may permit elimination of an external contact to such a source/drain region, which will result in even further conservation of lateral space on the semiconductor wafer.

Figure 15:
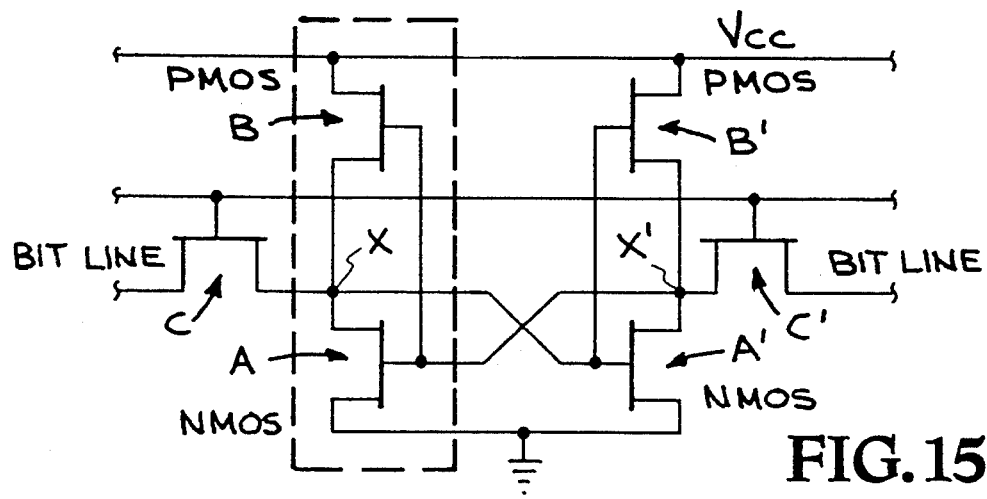
FIG. 15 is a schematic view of an S-ram memory structure in which the active device of the invention may be utilized.

Such a utilization of the MOS transistor of the invention is shown in the embodiment illustrated in FIGS. 15–20. FIG. 15 shows an S-ram type memory cell having memory transistors A and A'. Memory transistor A is coupled to the Vcc line through transistor B, and to a bit line through transistor C. Transistor A' is similarly coupled to the Vcc line through transistor B', and to a bit line through transistor C'. It will be noted that one of the source/drains electrodes of transistors A, B, and C are all commonly connected together at point X, and there is a similar connection at X' for transistors A', B', and C'. Construction of that portion of the depicted memory cell in FIG. 15 shown within the dotted lines by constructing at least one of the MOS transistors in accordance with the invention, as illustrated in FIGS. 16–20, will now be described.

Figure 16:
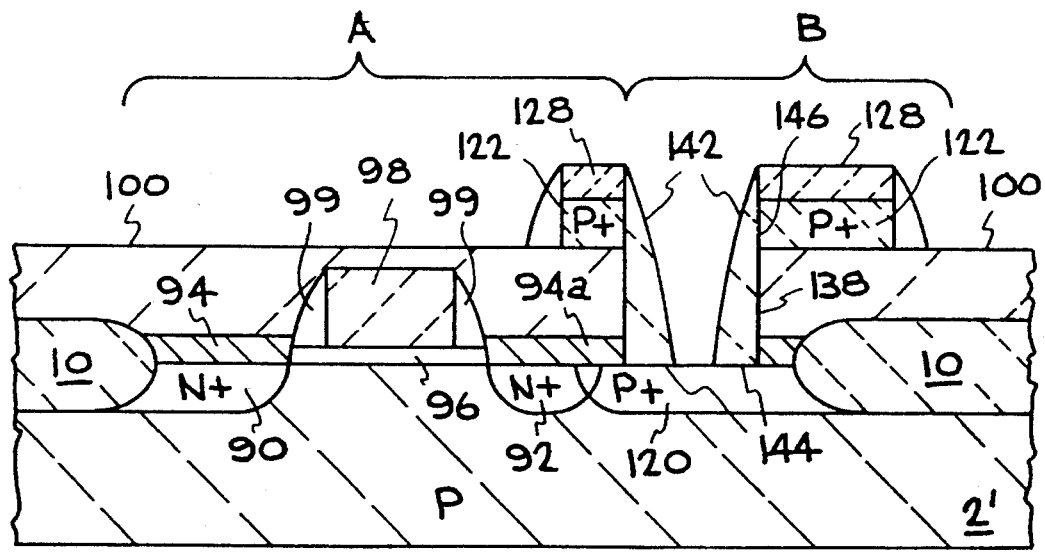
FIGS. 16–20 are fragmentary cross-sectional views of sequential steps in constructing the portion of the schematic of FIG. 15 enclosed in dotted lines, utilizing the active device of the invention.

Referring now to FIG. 16, NMOS transistor A is shown already formed conventionally on semiconductor substrate 2 comprising a source region 90, a drain region 92, titanium silicide 94 formed over source region 90, titanium silicide 94a formed over drain region 92, gate oxide 96 formed over the channel portion of substrate 2 between source region 90 and drain region 92, and a polysilicon gate electrode 98, with oxide shoulders 99 thereon, shown formed over gate oxide 96. An oxide layer 100 is then formed over the entire device, with contact openings to source/drain regions 90 and 92 and gate electrode 98 not yet formed through oxide layer 100.

In accordance with the invention, drain region 92 of transistor A is shown in FIG. 16 as formed contiguous with drain region 120 of transistor B to permit connection of drain region 92 of transistor A with drain region 120 of transistor B through silicide portion 94a which is formed over both drain region 92 and drain region 120 in accordance with the invention. The connection of drain region 92 of transistor A with drain region 120 of transistor B through silicide 94a on substrate 2 then comprises connecting point X (shown in the schematic of FIG. 15).

P+ polysilicon portion 122 (which will become the source region of transistor B), and nitride portion 128 are then formed over oxide layer 100 in similar fashion to the previously described formation of polysilicon source/drain region 22 and nitride portion 28 thereon. An opening 138 is then formed in oxide layer 100. An N doped polysilicon layer is then formed over the structure (either by depositing a P doped polysilicon layer or depositing an undoped polysilicon layer followed by implantation) and anisotropically etched, as previously described with respect to N doped polysilicon layer 40, to form N doped polysilicon layer 142 on the sidewall of opening 138 to form the P channel portion of transistor B which respectively communicates with drain region 120 at 144 and with source region 122 at 146.

Figure 17:
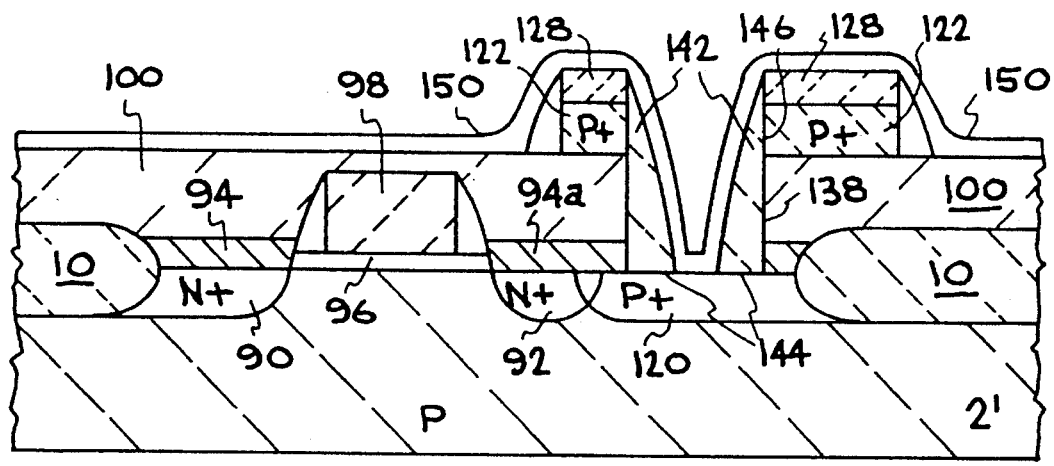
Figure 18:
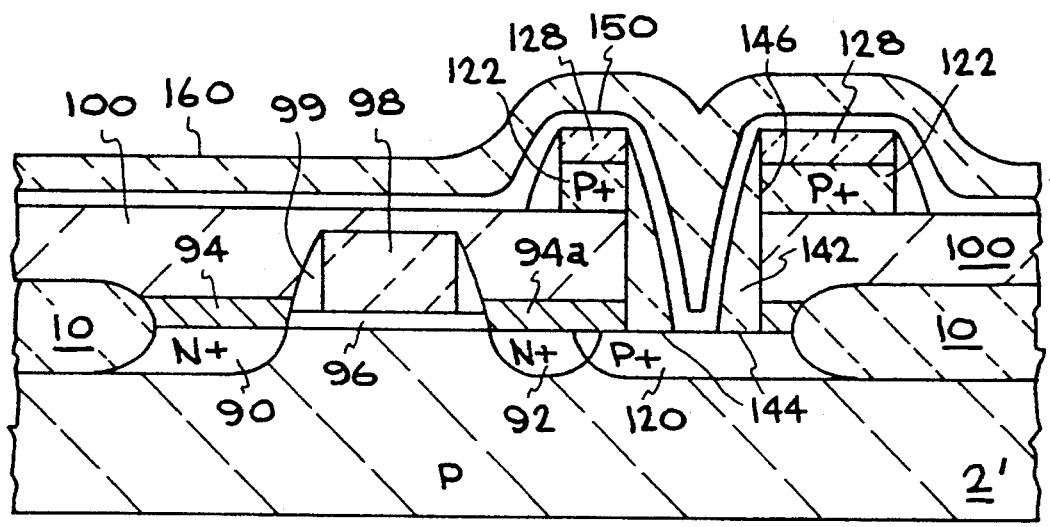
Figure 19:
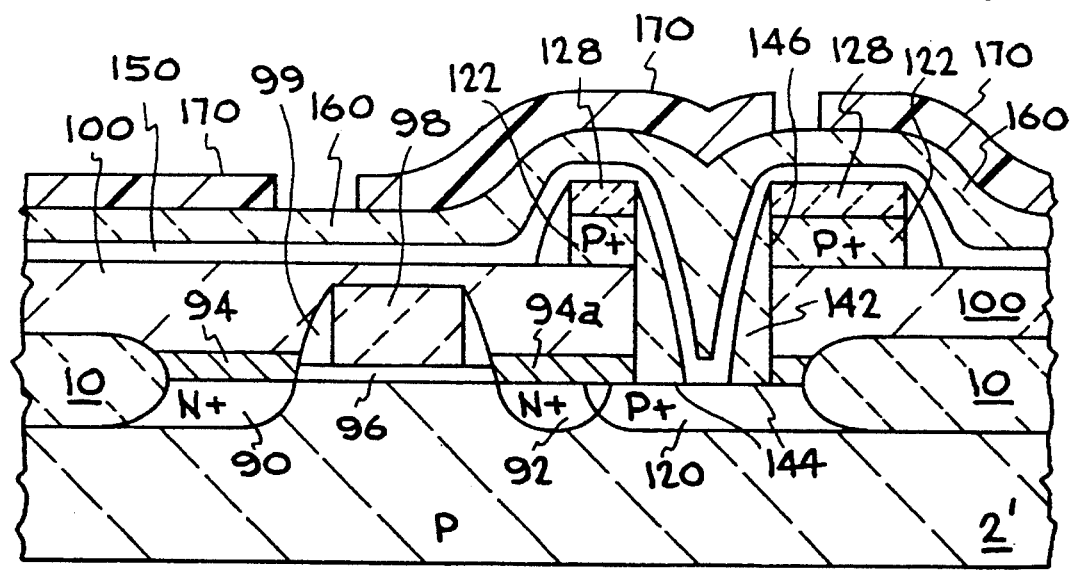
Figure 20:
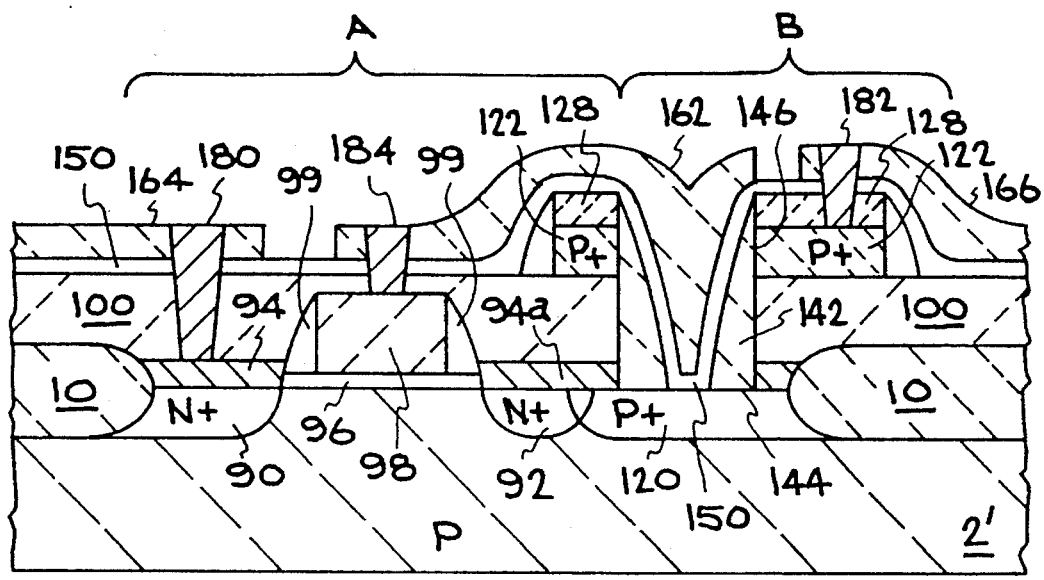

As shown in FIG. 17, a thin oxide layer 150 is then deposited or grown over the structure, including the exposed surface of polysilicon channel 142 in opening 138, to form the gate oxide for transistor B. A doped polysilicon layer 160 is then formed over oxide layer 150, as shown in FIG. 18, and a photoresist mask 170 is then formed over polysilicon layer 160, as shown in FIG. 18. Polysilicon layer 160 is then patterned, through photoresist mask layer 170, to form portions polysilicon portions 162, 164, and 166, with polysilicon portion 162 comprising the gate electrode.

Contact openings 180, 182, and 184 may then be formed and filled with a conductive material, e.g., doped polysilicon or tungsten, to respectively connect source region 90 of transistor A (through silicide 94) to polysilicon portion 164, using contact opening 180; source region 122 of transistor B with polysilicon portion 166, using contact opening 182; and gate electrode 98 of transistor A to polysilicon gate electrode 162 of transistor B, using contact opening 184.

It will be immediately noted that utilizing the transistor construction of the invention, drain region 92, drain region 120, and connecting silicon 94a need not be provided with an external connection for purposes of interconnecting the common drain region of transistors A and B. If, however, a contact needs to be made to drain region 92, drain region 120, and connecting silicide 94a, for example, for connecting drain region 92 to the drain or source of transistor C in the schematic of FIG. 15, such a contact could be made by extending the width of silicide 94a or by extending the area of silicide 94a along an axis normal to the plane of the structure shown in FIG. 20 to thereby permit external access to silicide 94a while avoiding polysilicon portion 162.

Figure 21:
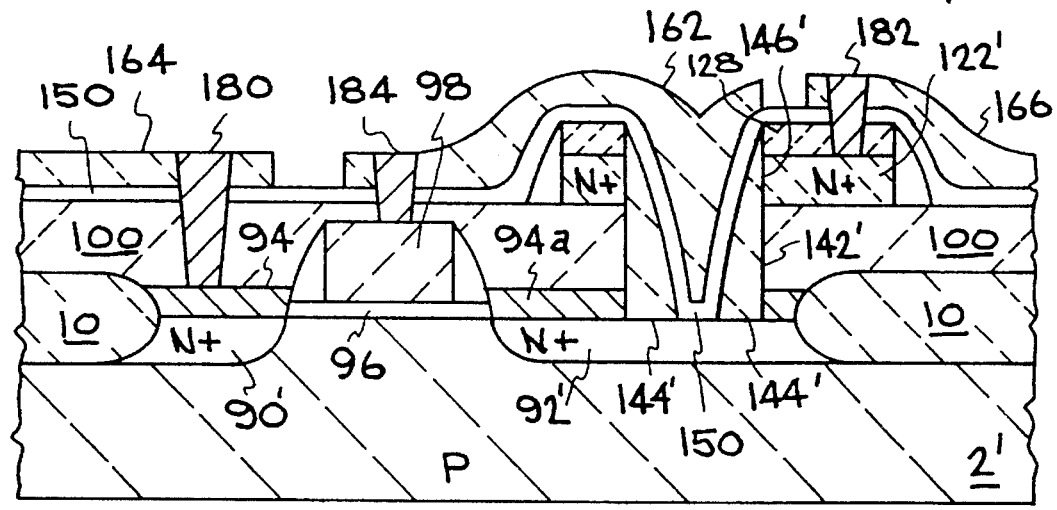
FIG. 21 is a fragmentary cross-sectional view of an alternate embodiment of the structure shown in FIG. 20 with both of the MOS devices constructed as N channel MOS devices.

As in the earlier described embodiment of FIGS. 1–14, while a P channel device formed in accordance with the invention has been illustrated for the formation of transistor B of the invention, it will be recognized that both transistor A and transistor B may be constructed as N channel devices, as illustrated in FIG. 21, wherein polysilicon 142' is then P doped, and 92' comprises a common drain region for both transistors A and B.

Figure 22:
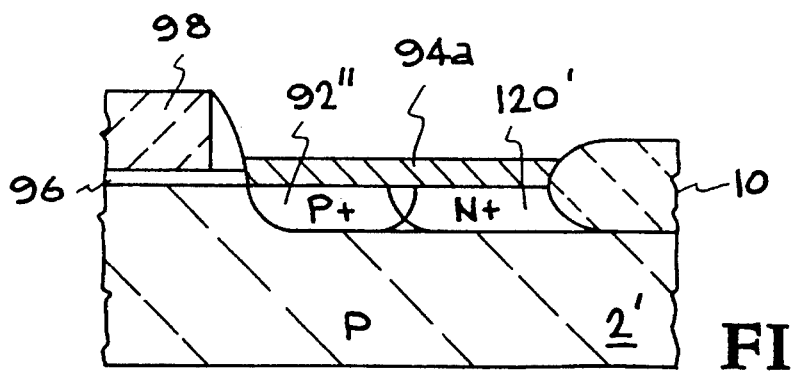
FIG. 22 is a fragmentary cross-sectional view of another embodiment of a portion of the structure shown in FIG. 20 showing the active device of the invention constructed as a N channel MOS device coupled to a P channel MOS device.

Alternatively transistor A may be constructed as a P channel device, while transistor B is constructed as an N channel device, as shown in FIG. 22, by respectively providing a P+ doped drain region 92" (for use in constructing transistor A of FIG. 15 as a P channel device), and an N+ doped drain region 120' (for use in constructing transistor B of FIG. 15 as an N channel device).

Turning now to FIG. 23, yet another embodiment of the invention is shown wherein transistors A, B, and C of the memory cell schematic shown in FIG. 15 are constructed side by side, with both transistor B and transistor C of FIG. 15 shown constructed in accordance with the invention. Before describing this embodiment in detail, it should be pointed out that in comparing the construction of transistors A, B, and C shown in FIG. 23 with depiction of transistors A, B, and C in the schematic of FIG. 15, it will be immediately apparent that transistors A, B, and C share a common drain region, 292 and 320 joined by silicide 94a in FIG. 23, which comprises common connecting point X in FIG. 15.

In FIG. 23, transistor A is shown constructed as an N channel device, while transistors B and C are shown constructed as P channel devices. This is merely for purposes of illustration. As previously discussed, either conventional memory transistor A, or transistors B and C of the invention, may be constructed as either P channel or N channel transistors, and they may be either the same or different from one another.

Conventional MOS memory transistor A is shown constructed in FIG. 23 similarly to the previously described constructions shown in either FIG. 21 or 22 with N+ source region 90' formed in P doped substrate 2' and gate electrode 98 formed over gate oxide 94. The N+ drain region for transistor A is shown at 292, with an adjoining common P+ drain region 320 shown for transistors B and C. As in the previous embodiments, the conventional memory transistor (A) is constructed first, followed by formation of oxide layer 100. Transistors B and C can then be formed simultaneously by first depositing a P+ polysilicon layer over the structure followed by deposition of an oxide layer and patterning of both layers to form P+ polysilicon source/drain regions 222b and 222c, and oxide portions 228b and 228c thereon. Openings 238b and 238c are then formed in oxide layer 100 for the respective formation of transistors B and C therein.

A further layer of N type polysilicon is then deposited over the structure and in openings 238b and 238c, followed by anisotropic etching of this polysilicon layer to respectively leave polysilicon channel portion 242b on the walls of opening 238b, and polysilicon channel portion 242c on the walls of opening 238c. A thin oxide layer 250, e.g., of from about 100 Angstroms to about 1000 Angstroms, is then deposited over the entire structure, including channel portions 242b and 242c in openings 238b and 238c, to form the gate oxide for transistors B and C. A further layer of N or P type polysilicon is then deposited over gate oxide layer 250 and patterned to form polysilicon electrode portions 262, 264, 268, and 269.

Figure 24:
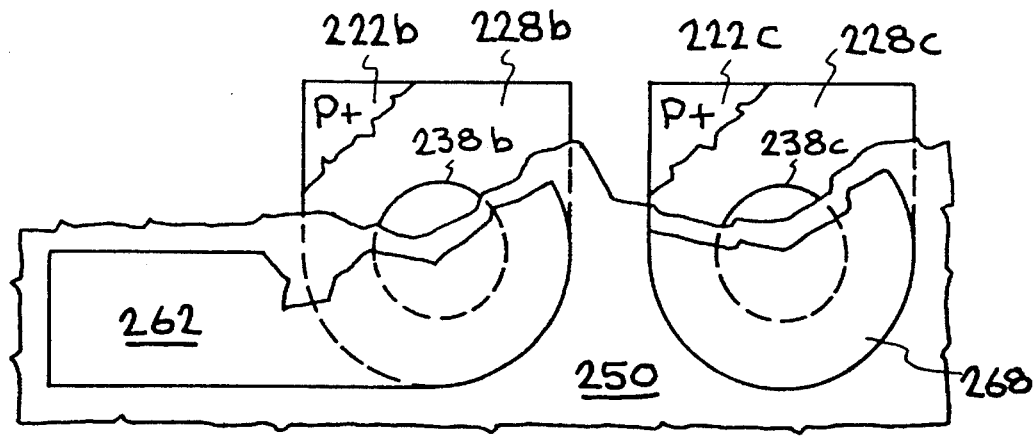
FIG. 24 is a fragmentary partially cutaway top view of a portion of the structure shown in FIG. 23.

Polysilicon electrode portion 268 then forms the gate electrode for transistor C, while polysilicon portion 262 forms the gate electrode for transistor B and also provides a connection to gate electrode 98 of transistor A through filled contact opening 284. Source region 90 may be connected, through silicide 94 and filled contact opening 280, to polysilicon portion 264. As shown in FIG. 24, source/drain electrode 222b of transistor B and source/drain electrode 222c of transistor C may be formed with an portion extending normal to the plane of FIG. 23 and not covered by polysilicon electrode 262 and 268 to permit subsequent connection to an upper metallization layer or layers.

It should be noted, in this regard, that the horizontal extensions of the polysilicon electrodes shown for the various elements of the transistors in all of the embodiments are for illustrative purposes only and may be varied as desired by those skilled in the art in order to provide the particular desired geometry for the formation of contact openings and vias through overlying oxide and metallization layers to provide the desired connection of the respective source, drain, and gate electrodes of the transistor(s) to other portions of the integrated circuit structure.

Figure 25:
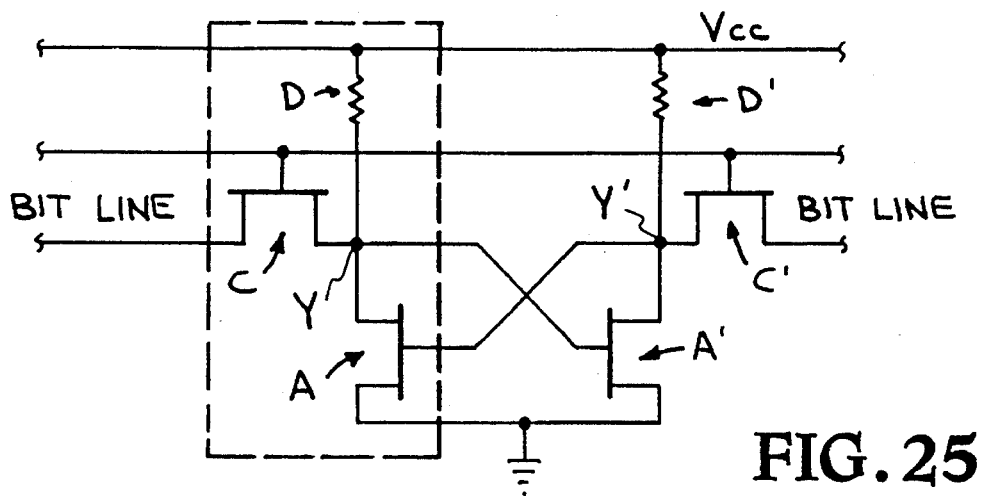
FIG. 25 is a schematic view of another S-ram memory structure in which the active device of the invention may be utilized.
Figure 27:
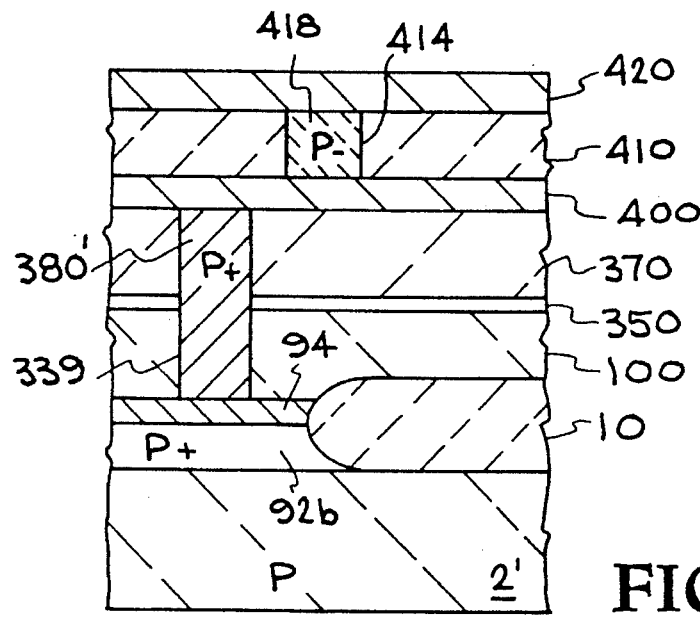
FIG. 27 is a fragmentary cross-sectional view of an alternate embodiment of the structure shown in FIG. 26.

Referring to FIGS. 25–27, yet another use or application of the transistor of the invention is illustrated wherein a memory cell is shown schematically in FIG. 25 having memory transistors A and A' respectively connected to the Vcc bus by resistors D and D', rather than by transistors B and B', as shown schematically in FIG. 15. In this embodiment, transistor C of the portion of the memory cell of FIG. 25 shown in dotted lines is constructed in accordance with the invention, with memory transistor A again constructed conventionally. As in the previous embodiments shown in FIGS. 16–24, a common source/drain region comprises a common connection point designated as Y in the schematic drawing of FIG. 25. That is, in this instance, the connection between one of the source/drain regions of transistor A, one of the source/drain regions of transistor C, and one end of resistor D.

In this embodiment, as shown in FIG. 26, after formation of the conventional memory transistor having source region 90', gate electrode 98 and drain region 92a, P+ source/drain region 322 and oxide portion 328 are formed over oxide layer 100, in the same manner as source/drain regions 22, 122 and 222b and 222c and oxide portions 28, 128, and 228b and 228c were formed in the previous embodiments.

Opening 338 is then formed in oxide layer 100 to form transistor C in similar fashion to the previous embodiments. A layer of N polysilicon is deposited over the structure and in opening 338 followed by an anisotropic etch to form N channel portion 342. A thin oxide layer is then deposited to form gate oxide 350, and then a further polysilicon layer is deposited and patterned to form gate electrode 362.

In this embodiment, a further oxide layer 370 is then formed over the structure, masked, and then etched to, form opening 339 which extends through oxide layers 370, 350, and 100 down to silicide 94 over drain region 92b'. Opening 339 is then filled with a very lightly P or N doped (nearly intrinsic) polysilicon material 380 to form resistor D shown in the schematic of FIG. 25 connected to point Y represented by drain region 92b' in FIG. 26. A further conductive layer (not shown) can then be formed over oxide layer 370 and resistive material 380 to form the Vcc line of FIG. 25.

FIG. 27 shows a slight modification of the structure of FIG. 26 wherein layer 380' represents a heavily doped polysilicon or tungsten or the like, i.e., a conductor instead of a resistor. A conductive layer 400, comprising a refractory metal layer, such as tungsten, molybdenum, titanium, tantalum, etc. is then formed over oxide layer 370 and an oxide layer 410 is formed over conductor layer 400. A via 414 is then formed in oxide layer 410 and via 414 is filled with a highly resistive polysilicon material 418 which then comprises resistor D of FIG. 25. A further conductive (metal) layer 420 can then be formed over oxide layer 410 and resistive material 418 representing the Vcc line shown in FIG. 25.

Figure 28:
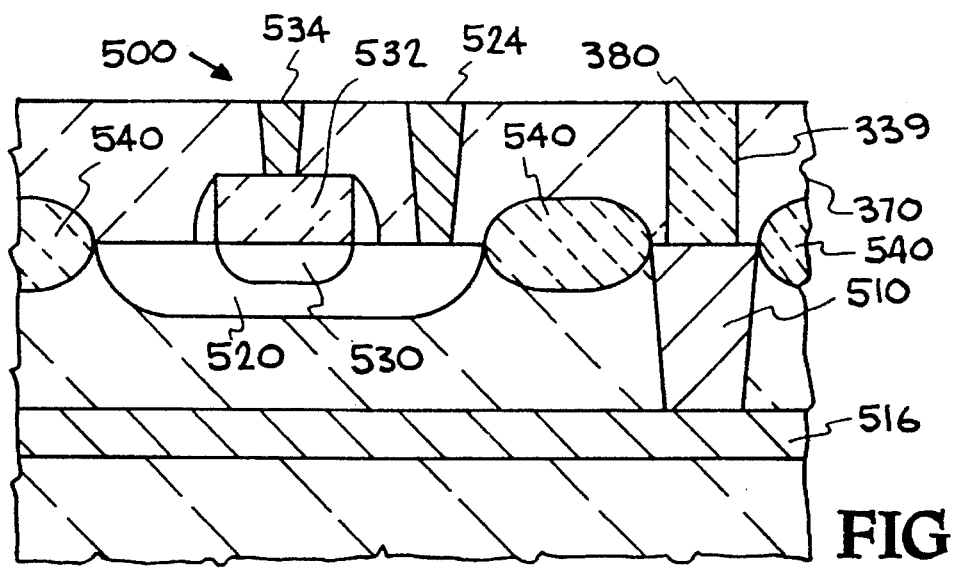
FIG. 28 is a fragmentary cross-sectional view of a bipolar device showing a resistor formed in a contact opening to one of the electrodes.

FIG. 28 shows another embodiment of the invention wherein the resistive element 380 of FIG. 26, formed in contact opening 339, is shown connected to collector contact 510 of a bipolar transistor 500, having a base region 520, a base contact 524, an emitter region 530, an emitter electrode 532, an emitter contact 534, and a buried layer 516, and field oxide portions 540. Resistive element 380, thus may be formed in any of the contact openings to any of the electrodes in either bipolar or MOS devices to thereby form a resistor generally normal to the surface of the substrate, thus conserving space on the substrate. Similarly, resistor 418 shown in FIG. 27 may be formed between the first and second metal layers above bipolar active devices as well as above MOS devices to form a resistor generally normal to the substrate surface.

Thus, it will be seen that in all of the illustrated embodiments shown in FIGS. 1–27, at least one MOS transistor has been constructed, in accordance with the invention, at least partially in an opening formed in an insulation layer, with one source/drain region formed in a semiconductor material below the insulation layer and the opening formed therein, and the other source/drain region formed on the top surface of the insulating layer and terminating immediately at the edge of at least one portion of the opening, with the channel portion of the transistor formed on the sidewall of the opening in between, and in electrical communication with, both the source/drain region below the insulating layer and the source/drain region on the surface of the insulating layer. The channel portion of the transistor of the invention is formed by depositing a semiconductor material over the structure, and in the opening, and then isotropically etching the semiconductor layer back, leaving the desired semiconductor channel material on the sidewall of the opening. By then depositing a thin oxide layer over the structure, a gate oxide layer can be formed over the semiconductor channel material on the sidewall of the opening. The gate electrode may then be formed by depositing a conductive layer over the gate oxide layer and then appropriately patterning this conductive layer to permit access, as desired, to other underlying regions or areas of the integrated circuit structure.

Minor variations of the structure of the invention illustrated and described herein will be apparent to those skilled in the art, particularly, for example, with regard to how electrical connections are made to the various electrodes of the transistor or transistors formed in the openings of the insulation layer. All such variations are deemed to be within the spirit of the invention which is to be limited only by the scope of the following claims.

What is claimed is:

1. A method of making an integrated circuit structure which includes the steps of:

a) forming a first insulation layer over at least one electrode region of an active device;

b) forming a first metal layer over said first insulation layer;

c) forming a contact opening through said first insulation layer to provide electrical communication between said first metal layer and said one electrode region of said active device;

d) forming a second insulation layer over said first metal layer;

e) forming a second metal layer over said second insulation layer;

f) forming a via in said second insulation layer between said first metal layer and said second metal layer; and g) forming a resistor in said via between said first and second metal layer.

2. The method of claim 1 including the further steps of forming a second opening in said first insulation layer; and forming an MOS type active device at least partially in said second opening in said first insulation layer.

\* \* \* \* \*